(12) United States Patent
Tonosaki et al.

(10) Patent No.: US 7,190,582 B2
(45) Date of Patent: Mar. 13, 2007

(54) COOLING DEVICE, ELECTRONIC EQUIPMENT DEVICE, AND METHOD OF MANUFACTURING COOLING DEVICE

(75) Inventors: Minehiro Tonosaki, Kanagawa (JP); Eisaku Kato, Tokyo (JP); Naoki Sano, Kanagawa (JP); Koji Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/498,335

(22) PCT Filed: Nov. 26, 2002

(86) PCT No.: PCT/JP02/12334
§ 371 (c)(1),
(2), (4) Date: Nov. 8, 2004

(87) PCT Pub. No.: WO03/050465

PCT Pub. Date: Jun. 19, 2003

(65) Prior Publication Data
US 2005/0047090 A1    Mar. 3, 2005

(30) Foreign Application Priority Data
Dec. 13, 2001   (JP)   .............................. 2001-380601

(51) Int. Cl.
*H05K 7/20*   (2006.01)
(52) U.S. Cl. ...................... 361/700; 361/699; 361/704; 257/714; 257/715; 174/15.2; 165/80.4; 165/104.26; 165/104.33
(58) Field of Classification Search ........ 361/699–700, 361/715, 719, 748; 257/714, 715; 174/15.1, 174/15.2; 164/80.4, 104.26; 62/259.2, 259.4
See application file for complete search history.

(56) References Cited

U.S. PATENT DOCUMENTS

| 4,392,362 A | * | 7/1983 | Little .......................... 62/51.1 |
| 4,931,905 A | * | 6/1990 | Cirrito et al. ............... 361/700 |
| 5,697,428 A | * | 12/1997 | Akachi .................. 165/104.21 |
| 6,437,981 B1 | * | 8/2002 | Newton et al. ............. 361/700 |

(Continued)

FOREIGN PATENT DOCUMENTS

JP    62-21591    2/1987

(Continued)

OTHER PUBLICATIONS

Notification for Reasons for Refusal for counterpart Japanese Patent Application No. 2001-380601 issued by the Japanese Patent Office on Jun. 27, 2006.

*Primary Examiner*—Boris Chervinsky
(74) *Attorney, Agent, or Firm*—Sonnenschein Nath & Rosenthal LLP (57) ABSTRACT

A compact, thin type and high cooling performance cooling device, an electronic apparatus and a method of manufacturing the same are provided. The cooling device (1) has a pair of a first substrate (2) and a second substrate (3) which are made of such a material having a low thermal diffusibility as glass, formed rectangular and bonded together via a silicon member (4). On bonding surfaces of these substrates (2) and (3), grooves (5) and (6) are formed. These grooves (5) and (6) are formed so as to function as a heat pipe of a loop type when these substrates (2) and (3) are bonded.

3 Claims, 13 Drawing Sheets

U.S. PATENT DOCUMENTS

| | | |
|---|---|---|
| 6,501,654 B2 * | 12/2002 | O'Connor et al. .......... 361/699 |
| 6,533,029 B1 * | 3/2003 | Phillips ................. 165/104.26 |
| 6,561,208 B1 * | 5/2003 | O'Connor et al. ....... 137/15.18 |
| 6,976,527 B2 * | 12/2005 | Kirshberg et al. ..... 165/104.33 |
| 2002/0130408 A1 * | 9/2002 | Pike et al. .................. 257/714 |

FOREIGN PATENT DOCUMENTS

| | | |
|---|---|---|
| JP | U 62-021591 | 2/1987 |
| JP | 07-63487 | 3/1995 |
| JP | 2000-002493 | 1/2000 |
| JP | 2000-2493 | 1/2000 |
| JP | 2000-124374 | 4/2000 |
| JP | 2000-193385 | 7/2000 |
| JP | 2001-125151 | 5/2001 |
| JP | 2001-257297 | 9/2001 |
| JP | 2004044917 A * | 2/2004 |

* cited by examiner

COOLING DEVICE, ELECTRONIC EQUIPMENT DEVICE, AND METHOD OF MANUFACTURING COOLING DEVICE

BACKGROUND OF THE INVENTION

The present invention relates to a cooling device for cooling heat generated by a driver for a card-type storage medium for use, for example, in a personal computer, a digital camera and the like, and to a method of manufacturing the same. The present invention also relates to electronic apparatuses such as a personal computer, a digital camera, etc., incorporating this cooling device.

Since storage media such as Memory Stick (registered trade mark), Smart Media (registered trade mark), Compact Flash (registered trade mark) are compacter and thinner in size in comparison with conventional ones such as a floppy disk and the like, and in addition, since a storage capacity thereof can be made enormous, it is becoming widely used in electronic apparatuses such as personal computers, digital cameras and the like.

This storage media include such a type which has a flash memory and a driver integral therewith and another type in which the driver is installed separately in the apparatus or in another card or the like. In any case, its storage capacity is becoming considerably large.

By the way, with an increase in the capacity of the storage media along with such a trend of mass storage, a large amount of heat is generated from the above mentioned driver, thereby causing a problem of malfunctioning or the like to occur.

Therefore, provision of a cooling device is considered, for example, on a side of the electronic apparatus, and as such a cooling method, a technique using a heat pipe is referred to.

The heat pipe referred to here is made of a metal pipe having a capillary tube structure in an internal wall of the pipe, wherein the inside thereof is in vacuum and a small amount of water, Hydrochlorofluorocarbon or the like is sealed therein. When one end of the heat pipe is heated by making contact with a heat source, the liquid sealed therein is evaporated and vaporized to a gas, then as a latent heat (vaporization heat), the heat is absorbed. Then, it (vaporized gas) moves to a low temperature section at a high speed (almost at sonic speed), in which it is cooled to return again to the liquid by releasing the heat (latent heat discharge due to condensation). As the liquid returns to its original place passing through the capillary tube structure (or by gravity), it is possible continuously and efficiently to transport the heat.

However, as the conventional heat pipe is of a tube type and becomes spatially a large-scaled device, it is not suitable as a cooling device for use in electronic apparatuses such as the personal computer, digital camera and the like for which a compacter and thinner size is demanded.

Thereby, in order to make the heat pipe compacter, a cooling device has been proposed, wherein grooves are formed in each bonding surface of a silicon substrate and a glass substrate, and by bonding these substrates, a flow channel for constituting a heat pipe is formed between these substrates. In addition, at the time of the above-mentioned bonding thereof, a small amount of water or Hydrochlorofluorocarbon or the like is sealed therein, which, by undergoing phase changes within the heat pipe, acts a role as the heat pipe.

However, if the heat pipe is constructed using the silicon substrate as described above, because of a good heat conductivity of the silicon itself, heat from an object to be cooled is diffused well on the surface of the silicon, thereby causing a problem that evaporation of the liquid inside thereof becomes insufficient or does not evaporate at all, thus the function as the heat pipe is not demonstrated sufficiently.

The present invention has been contemplated to solve the above-mentioned problems associated with the conventional art, and an object thereof is to provide a cooling device of a compacter and thinner type as well as with an improved cooling performance, electronic apparatuses using the same and a method for manufacturing the same.

SUMMARY OF THE INVENTION

In order to accomplish the above-mentioned object, a cooling device according to a first aspect of a preferred embodiment of the present invention is characterized by comprising: a pair of a first and a second substrates, which are made of a material having a lower thermal conductivity than silicon, each of which is disposed opposingly, and each of which has grooves for constituting a heat pipe formed in each opposing surfaces; and a bonding member interposed between the first and the second substrates for bonding the first and the second substrates securely.

According to the present invention, as the two substrates are bonded, and the grooves formed in their opposing surfaces constitute a flow channel of the heat pipe, a compact and thin type becomes possible. In addition, as the material constituting the heat pipe has a lower thermal conductivity than silicon, the thermal diffusion can be prevented. Thereby, the cooling performance thereof is improved so that a function as the heat pipe can be sufficiently achieved. Further, as the bonding of the two substrates is performed via the bonding member, it becomes possible to obtain a secured adhesion therebetween. That is, as a material of the substrates, if glass, plastics or the like that has a lower thermal conductivity than silicon and is more applicable in terms of workability is used, adhesion between these substrates, however, becomes impaired. Therefore, according to the present invention, in order to complement this drawback, the bonding member is interposed between these substrates. By way of example, as a combination of the materials in this case, it may be arranged such that both the two substrates are glass, plastics, or either of which is glass and the other is plastic. Further, from a viewpoint of workability, economy or the like, it is more preferable to use silicon, copper or the like as the bonding member.

An electronic apparatus according to a second aspect of a preferred embodiment of the present invention is characterized by comprising: a slot capable of loading and unloading a card-type storage medium having a flash memory therethrough; and a driver which is provided either on a side of the storage medium, on a side of the electronic apparatus, or on a portion separated from the apparatus, wherein in order to cool heat generated from the driver, the above-mentioned cooling device having the above-mentioned structure is provided.

According to the present invention, because the cooling device having the above-mentioned structure, i.e. the compact and thinner sized, and featuring an improved cooling performance is installed, the electronic apparatus itself is rendered compacter and thinner, and also the occurrence of malfunction or the like thereof is eliminated.

A method of manufacturing the cooling device according to a third aspect of the present invention is characterized by comprising: a step of forming grooves for constituting a heat pipe in each surface of a first and a second substrates made of a material having a lower thermal conductivity than silicon; a step of forming a bonding member on a surface either of the first and the second substrates for securely bonding the first and the second substrates thereby; and a step of bonding the surfaces of the first and the second substrates via the bonding member interposed therebetween.

According to the method of the present invention, it becomes possible to manufacture the cooling device having the above-mentioned structure efficiently and reliably.

According to an aspect of an embodiment of the present invention, the above-mentioned bonding step in the method of manufacturing the above-mentioned cooling device is characterized by comprising an anodic bonding, ultrasonic bonding or thermal fusion bonding. By arranging as described above, it becomes possible to bond efficiently and reliably.

According to an aspect of the embodiment of the present invention, in the method of manufacturing the above-mentioned cooling device, the step of forming the bonding member is characterized by comprising forming the bonding member by sputtering. According to the arrangement described above, it becomes possible uniformly to form a thin film without limitation to materials. Thereby, at the time of assembling a heat pipe by bonding the substrates, it becomes possible to secure a reliable adhesion to be made therebetween due to non-existence of irregularities on the bonding member.

According to an aspect of the preferred embodiment of the present invention, in the method of manufacturing the cooling device described above, the step of forming the grooves is characterized by comprising forming the grooves by chemical etching or powder beam etching. According to such arrangement as described above, for example, by the chemical etching, or, in particular, in the powder etching, because fine particles are used, it is enabled for them to reach even minute parts at the time of forming the grooves. Thereby, because the grooves are formed accurately, it is enabled to accomplish the function of the heat pipe reliably.

DETAILED DESCRIPTION OF THE PRESENTLY PREFERRED EMBODIMENTS

By referring to the accompanying drawings, preferred embodiments of the present invention will be described in the following.

[Cooling Device]

Figure 1:
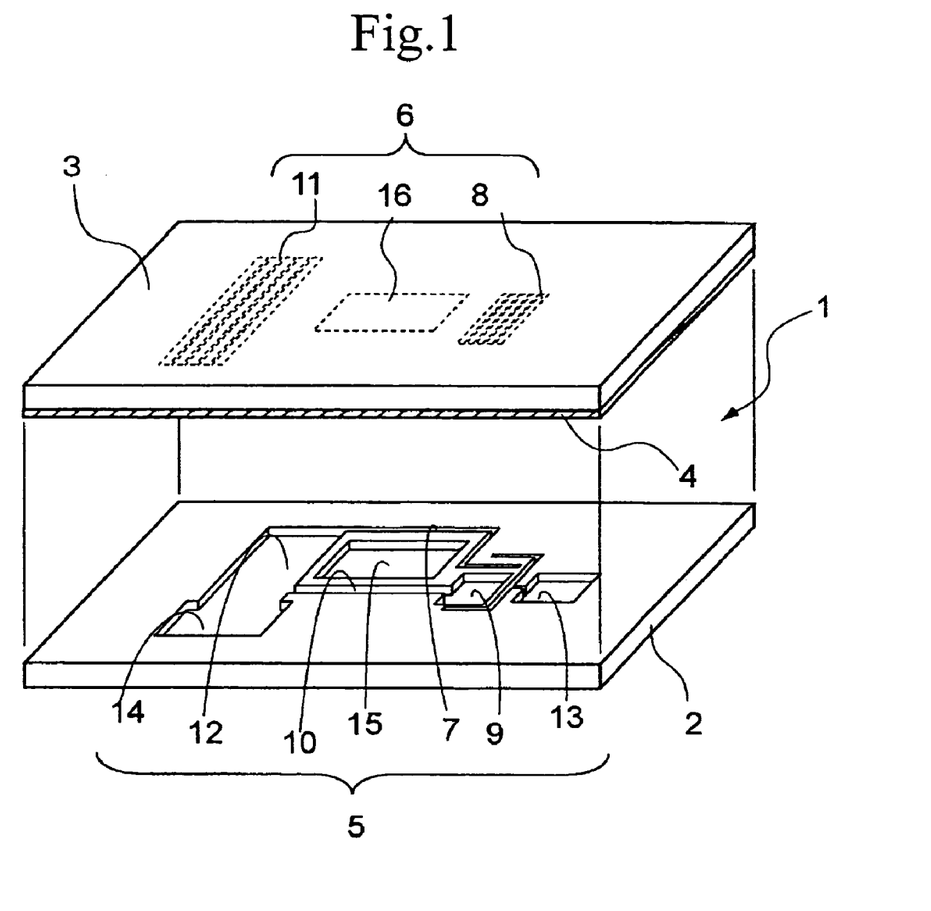
FIG. 1 is a perspective view showing an exploded view of a cooling device according to the present invention.
Figure 2:
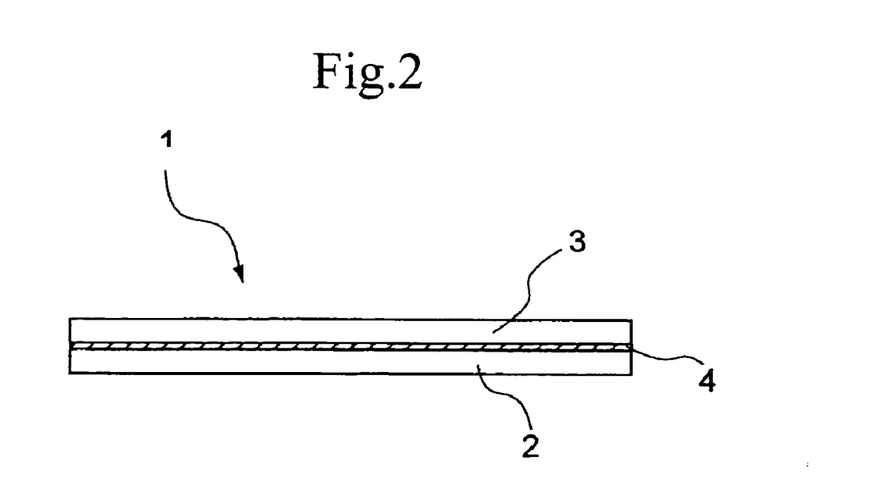
FIG. 2 is a cross-sectional view showing the cooling device according to the present invention in an assembled state.

FIG. 1 is a perspective view of a cooling device according to the present invention in an exploded state, and FIG. 2 is a cross-sectional view of the cooling device in an assembled state.

As shown in FIGS. 1 and 2, in a cooling device 1, a pair of rectangular-shaped a first glass substrate 2 and a second glass substrate 3 made of, for example, Pyrex glass (registered trade mark)) or Corning 7740 glass are bonded via a silicon member 4. On bonding surfaces of these substrates 2, 3, grooves 5 and grooves 6 are formed. These grooves 5 and 6 are formed so as to function as a heat pipe in the shape of a loop when these substrates 5 and 6 are bonded.

As each of these substrates 5 and 6 is made of glass, it has a low thermal diffusibility which is useful as the heat pipe. However, as adhesiveness of the bonding between these glass substrates 2 and 3 is low, a reliable bonding is secured by interposing the silicon member 4 therebetween.

By referring to FIGS. 3 and 4, a structure of the grooves formed in each substrate 2, 3 will be described in the following.

As to a cross-sectional structure of the grooves, although it is explained in the description of FIG. 8 to be described later by way of example of a groove having a rectangular cross section, the cross-sectional structure of the groove according to the present invention is not limited thereto, and it may also have a cross-section in the shape of a triangle, semicircle, circle or the like.

Figure 3:
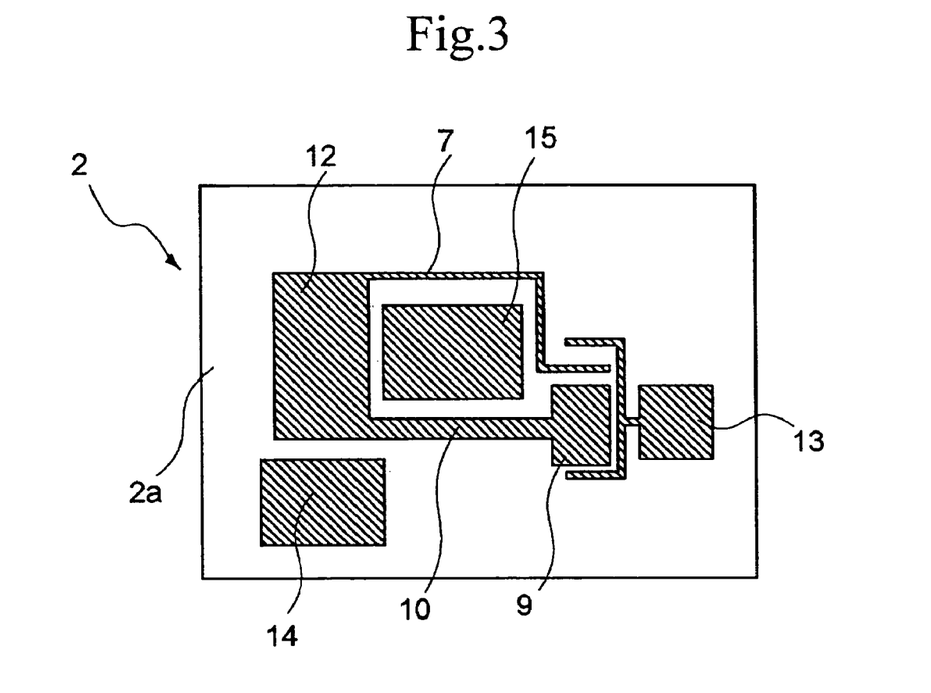
FIG. 3 is a plan view showing a configuration of grooves formed in a first glass substrate of the cooling device according to the present invention.

As shown in FIG. 3, on a surface 2a of the first glass substrate 2, there is formed the groove 5. A main part of this groove 5 is comprised of a flow channel through which liquid and vapor flow, and a reservoir tank for supplying the liquid. More specifically, as the groove 5, there is provided a flow channel 7 through which liquid such as water flows and then the liquid is introduced from the flow channel 7 to a wick 8 to be described later. The liquid introduced into the wick 8 is vaporized to a gas therein, and is introduced into a gas receiving section 9. This gas is introduced into a radiator 11 via a flow channel 10 so as to be condensed and changed into the liquid, which then moves to a low temperature section 12. Further, it returns to the flow channel 7 again. As described above, a circulation between the liquid and gas takes place.

In a reservoir 13 and a storage section 14, the liquid is stored. The liquid in the reservoir 13 is caused to flow out when an amount of the liquid within the gas receiving section 9 becomes smaller than a prescribed amount. Further, the liquid in the storage section 14 is caused to flow out when an amount of the liquid within the low temperature section 12 becomes smaller than a prescribed amount. That is, the reservoir 13 and the storage section 14 store the liquid in order to prevent for the inside of the heat pipe from drying out, and it is arranged to supply the liquid into these reservoir 13 and the storage section 14 when required.

Further, at a position in the center of the glass substrates 2, 3 and in the vicinity of the flow channels 7 and 10, there is provided a thermal insulation hole 15, whereby, it is ensured to prevent thermal diffusion.

Figure 4:
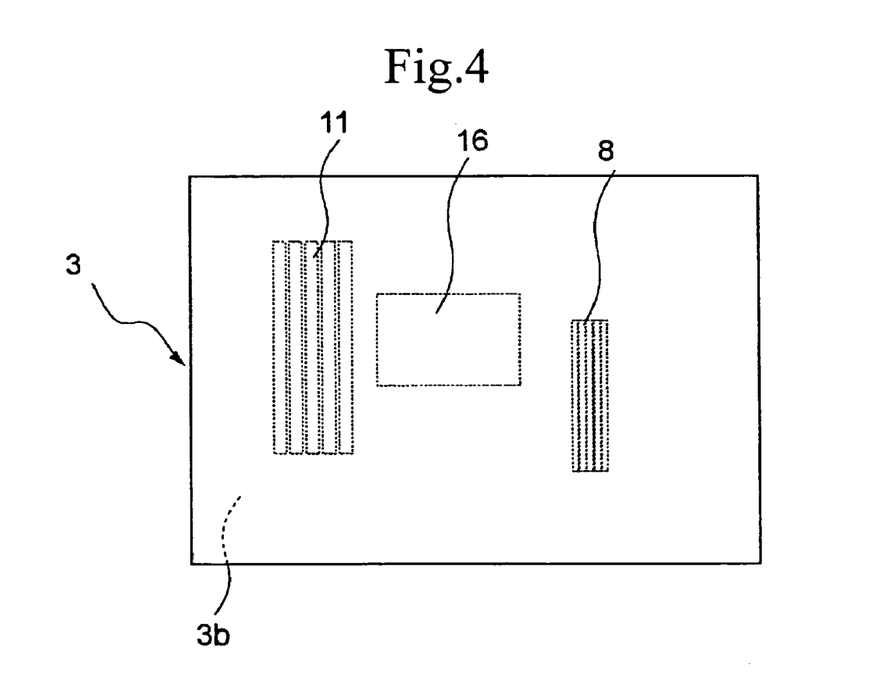
FIG. 4 is a plan view showing a configuration of grooves formed in a second glass substrate of the cooling device according to the present invention.

As shown in FIG. 4, on a surface 3b of the second substrate 3, the groove 6 is formed. The groove 6 includes the wick 8, the radiator 11 and a thermal insulation hole 16.

The wick 8 which functions as a cooling section vaporizes the liquid introduced from the flow channel 7 and/or the reservoir 13, and flows out the gas vaporized therein into the gas receiving section 9.

The radiator 11 condenses the gas introduced from the flow channel 10 into a liquid and circulates it to the low temperature section 12.

By way of example, in this preferred embodiment of the present invention, each of the wick 8 and the radiator 11 is comprised of a plurality of fine grooves Further, in a position opposite to the thermal insulation hole 15 described above, there is provided the thermal insulation hole 16. These thermal insulation holes 15, 16 are provided as grooves on the substrates 2, 3 as means for preventing thermal diffusion.

Figure 5:
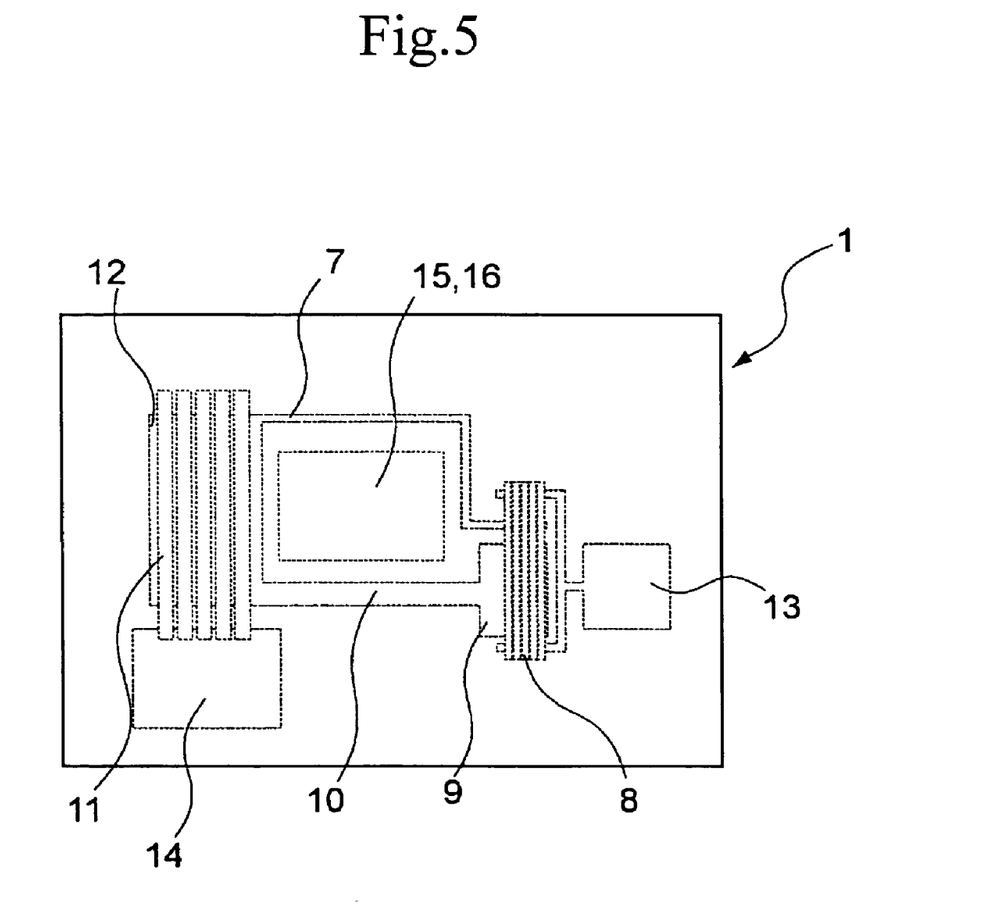
FIG. 5 is a plan view showing an assembled state of the first and the second glass substrates of the cooling device according to the present invention.

FIG. 5 shows a state of the first glass substrate 2 and the second glass substrate 3 as bonded via the silicon member 4.

Inside a heat pipe constructed by bonding the first glass substrate 2 and the second glass substrate 3 there is sealed a liquid. Then, the liquid sealed therein transfer the heat by changing its state from the liquid to the gas or from the gas to the liquid, thus circulating within the heat pipe, accordingly, functioning as the cooling device 1.

In the following, a mode of this circulation between the liquid and the gas will be described conveniently starting from the flow channel 7.

At first, the liquid flows from the flow channel 7 into the wick 8. At this time, if an amount of the liquid flowing into the wick 8 is below a predetermined amount, in order to avoid a dry-out, an amount of the liquid covering the shortfall is to be supplied from the reservoir 13.

The liquid flowed into the wick 8 is heated and boiled. A gas evaporated by boiling is allowed to flow into the gas receiving section 9. This gas is caused to flow into the radiator 11 via the flow channel 10, where it is condensed to a liquid. The liquid thus condensed flows into the low temperature section 12 disposed below the radiator 11. This liquid is once again circulated from the low temperature section 12 to the flow channel 7. Further, in a case where the amount of the liquid flowed from the low temperature section 12 into the flow channel 7 is below a predetermined amount, the liquid stored in the liquid storage section 14 is allowed to flow into the low temperature section 12.

By way of example, in the embodiment of the present invention, glass was used as a material for the substrates. However, it is not limited thereto, and other materials, for example, such as plastic may be used, or a combination of a glass substrate and a plastic substrate may be used as well. Further, any other material, provided that it has a lower thermal conductivity than silicon, can be used as a material of the substrate.

Figure 6A:
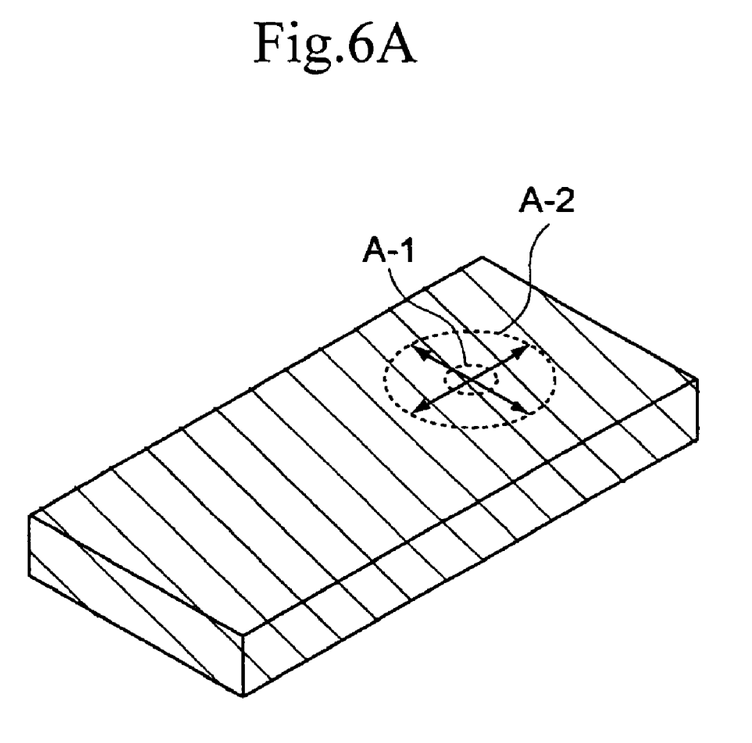
FIGS. 6A to 6B are schematic diagrams for comparing thermal diffusion areas in respective substrates for use in a related art and the present invention.
Figure 6B:
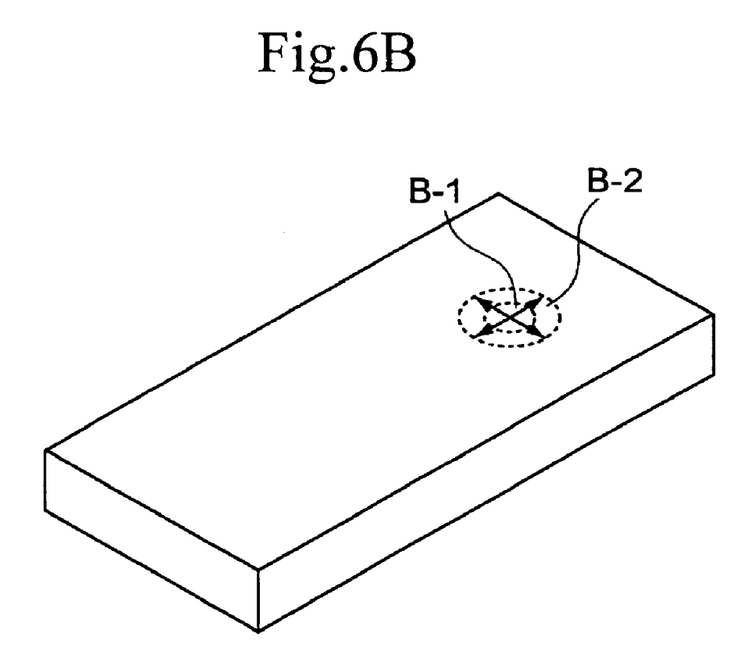

FIGS. 6A to 6B are schematic diagrams showing heat diffusion areas on respective substrates in a predetermined period of time, in which FIG. 6A shows a case where silicon was used as the material of the substrate, and FIG. 6B shows a case where glass was used as the material of the substrate.

As shown in FIG. 6A, heat from a heat source A-1 (wick) on the silicon substrate diffuses broadly in directions as indicated by arrows in an area (A-2). In contrast to this, heat from a heat source B-1 (wick) on the glass substrates 2, 3 does not diffuse so broadly and diffuses within an area (B-2) as indicated by arrows.

In order to function as a heat pipe, heat greater than a predetermined quantity must be concentrated in the wick. However, in the case where the material of the substrate is made of silicon as shown in FIG. 6A, its thermal diffusion becomes large such that its function cannot be attained sufficiently. In contrast thereto, in the case of the present invention, where the material of the substrate is made of glass or plastic as shown in FIG. 6B, its thermal diffusion is limited, that is, the heat is concentrated in the wick so that the function as the heat pipe is sufficiently accomplished.

[A Method of Manufacturing the Cooling Device]

Figure 7:
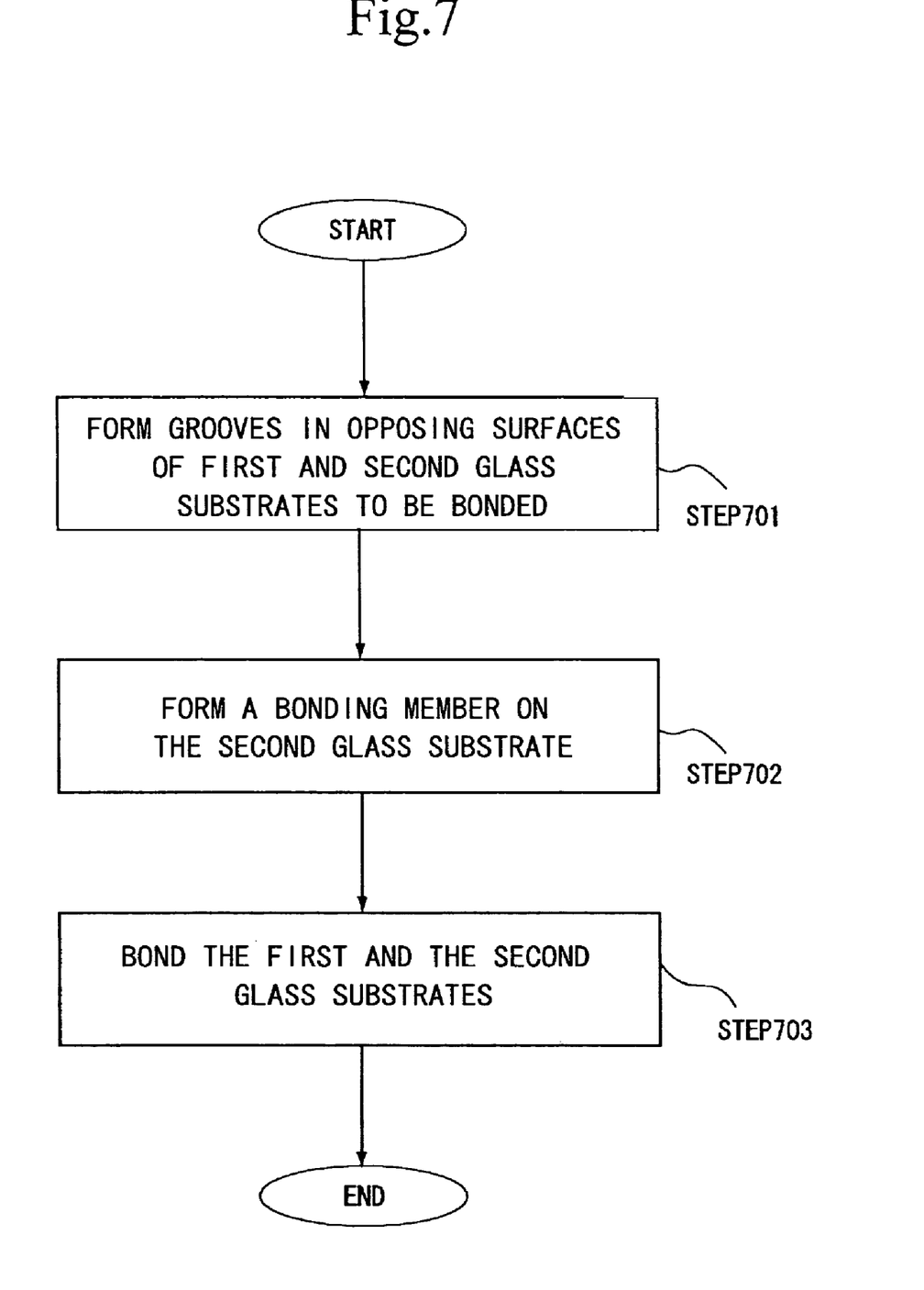
FIG. 7 is a process flowchart showing a method of manufacturing the cooling device according to the present invention.

FIG. 7 shows a process of manufacturing the cooling device.

Firstly, grooves for constituting a heat pipe are formed on the substrates 2, 3 (Step 701). On the surface 2a of the first glass substrate 2 to be disposed on the bottom side, there are formed grooves for use as a flow channel, a storage tank and the thermal insulation hole 15. Further, on the surface 3b of the second glass substrate 3 to be disposed on the upper side, there are formed grooves for use as the wick 8 having a function to effect a state change from liquid to gas, the radiator 11 having a function to effect a state change from gas to liquid, and a thermal insulation hole.

Next, a silicon thin film is formed as a bonding member on the surface 3b of the second glass substrate 3, for example, by sputtering (Step 702). The glass substrate 2, 3, as they have a low thermal diffusibility, can adequately demonstrate the function as the heat pipe, however, they have a drawback that it is not yet suitable thereto because that the adhesiveness of bonding between these glass substrates 2 and 3 is weak. Therefore, by forming the silicon thin film on the surface 3b of the second glass substrate 3, the adhesiveness is improved. By way of example, a film thickness of the silicon thin film is preferably approximately 200 to 500 nm. Further, of course, the sputtering may be performed on the surface of the first glass substrate 2 as well.

Then, the first glass substrate 2 and the second glass substrate 3 having the grooves formed thereon respectively are bonded via the silicon thin film (Step 703). When mutually bonding the glass substrates 2 and 3, a substance that undergoes state changes within the heat pipe, for example, water is sealed in the grooves.

Figure 8:
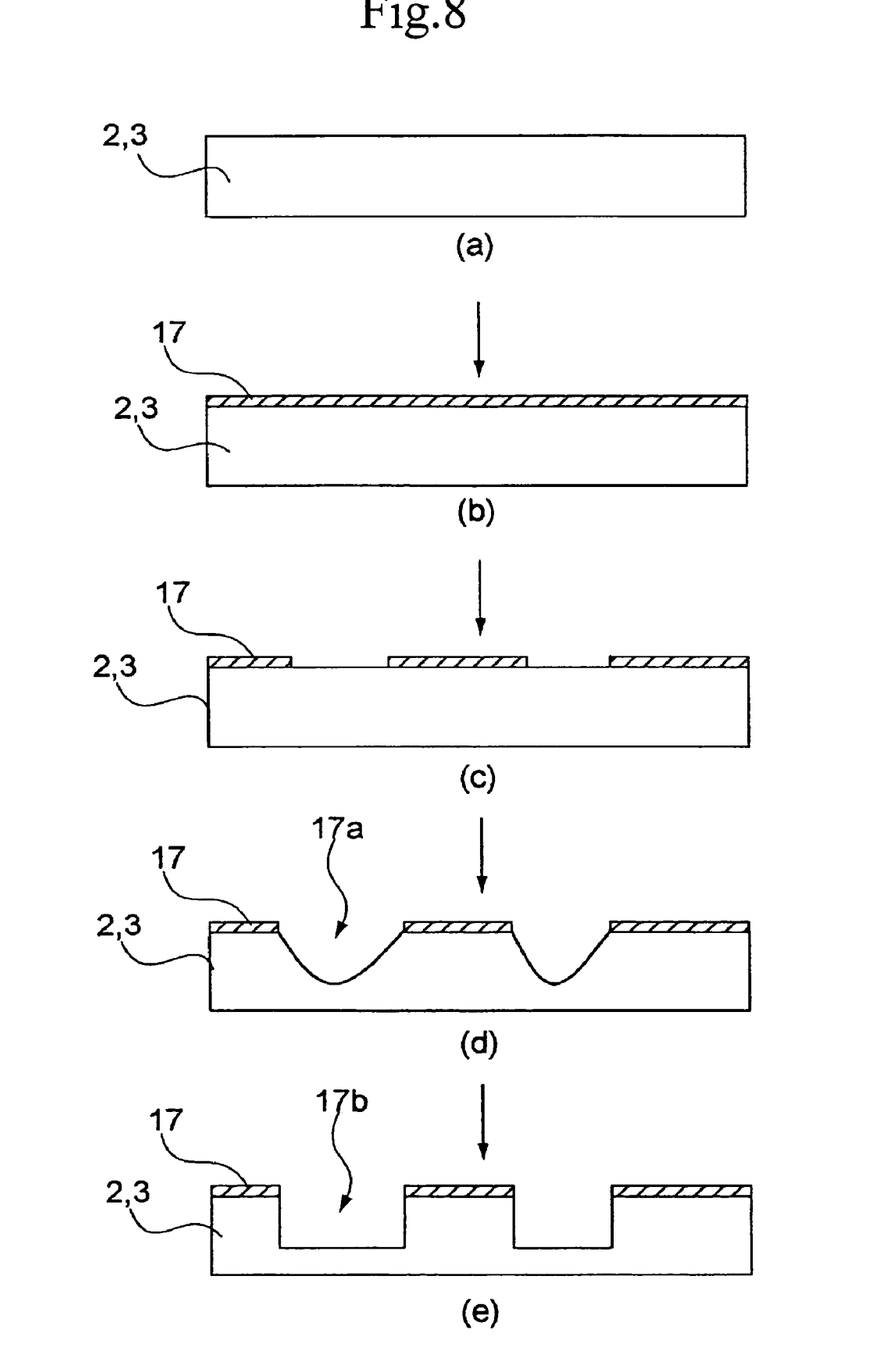
FIG. 8 is a schematic block diagram showing steps of forming grooves in the cooling device according to the present invention.

FIG. 8 is a diagram for more specifically describing the steps of forming grooves in Step 701.

Firstly, the glass substrate 2, 3 is cleaned in a rinse solution or the like (FIG. 8(*a*)).

On the surface of the glass substrate 2, 3 cleaned, a resist 17 comprising an organic solvent, for example, "ORDYL" (product of Tokyo Ohka Kogyo Co., Ltd.) or the like is coated (FIG. 8(*b*)).

Then, a patterning formation is performed (FIG. 8 (*c*)). In the patterning formation, at first, light exposure using a photo mask is carried out to form a latent image of the mask pattern on the resist 17. The resist film is patterned by development.

Next, by blowing alumina powders of 50 to 60 μm onto the patterned glass substrate 2, 3, a powder beam etching as a first stage etching process is performed (FIG. 8 (*d*)). By this etching process, a groove 17*a* having a curved surface is formed.

Then, by performing a DRIE (Deep Reactive Ion Etching), RIE (Reactive Ion Etching) or limonene etching, a groove 17*b* whose cross-section has a right-angle is formed (FIG. 8(*e*)).

Hereinabove described is a series of processing for forming the grooves on the glass substrates 2, 3. In the following, more detailed description of each etching method will be made.

Figure 9:
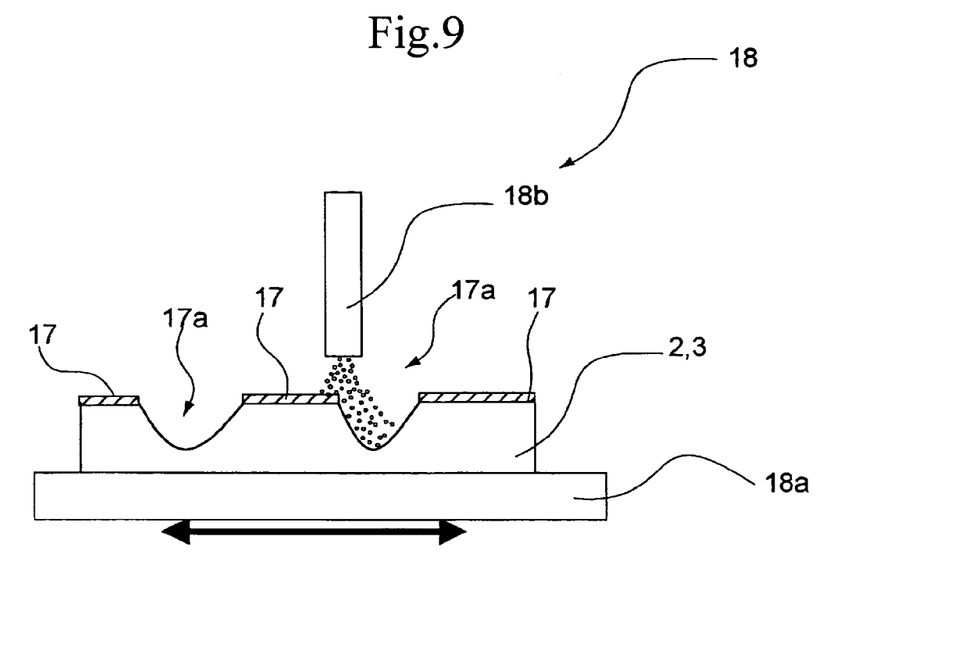
FIG. 9 is a schematic diagram showing a powder beam etching apparatus used for forming the grooves of the cooling device according to the present invention.

FIG. 9 is a diagram showing a constitution of a powder beam etching apparatus 18 for performing the above-mentioned powder beam etching process.

The glass substrate 2, 3 having patterning formed thereon is mounted on a movable carriage 18*a*. In accompaniment with the movement of the carriage 18*a* to left and right directions, the glass substrate 2, 3 disposed on the carriage 18*a* is also moved to the left and right directions. Above the glass substrate 2, 3, there are disposed a number of powder beam nozzles 18*b* in a direction perpendicular to the direction of the movement of the substrate by the carriage 18*a*.

In accompaniment with the movement of the glass substrate 2, 3 to the left and the right directions, alumina powders of approximately 50 to 60 μm are blown against the glass substrate 2, 3. Thereby, the alumina powders are ensured uniformly to be blown against the glass substrate 2, 3. By the alumina powders blown against an exposed portion having no patterning, the groove 17*a* having a curved surface is formed.

Figure 10:
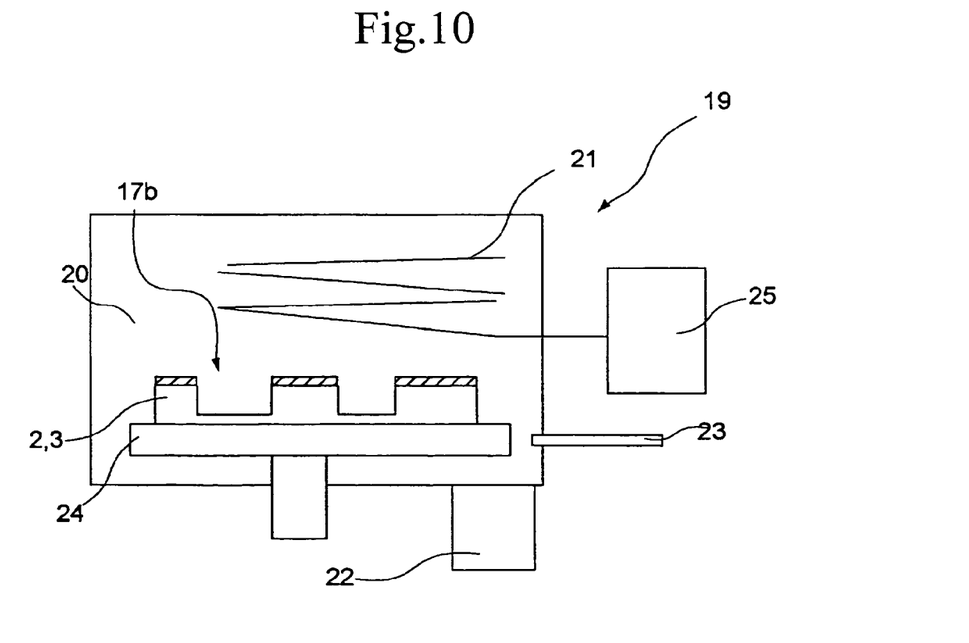
FIG. 10 is a schematic diagram showing a DRIE apparatus used for forming the grooves of the cooling device according to the present invention.

FIG. 10 is a diagram showing a constitution of a DRIE apparatus for forming the groove 17*b* whose cross-section has a right-angle from the above-mentioned groove 17*a* having the curved surface.

The DRIE apparatus 19 has a vacuum chamber 20 for accommodating therein the glass substrate 2, 3. In the upper direction in the vacuum chamber 20, a helicon wave antenna 21 is disposed. Further, to the vacuum chamber 20, a vacuum pump 22 for depressurizing the air from the chamber 20 is connected, and also a gas inlet port 23 for introducing a gas is provided.

The glass substrate 2, 3 formed with the groove 17*a* having the curved surface is mounted on a loading table 24 for the vacuum chamber 20. After loading the glass substrate 2, 3, inside the vacuum chamber 20 is depressurized by the vacuum pump 22. After then, for example, a $SF_6$ gas is introduced into the vacuum chamber 20 from the gas inlet port 23. Further, a power supply 25 is turned on, a magnetic field is applied to the vacuum chamber 20, and also a high frequency is applied to the helicon wave antenna 21. By generating helicon waves inside the vacuum chamber 20, and by transporting energy from the helicon waves to electrons through the process of Landau damping, electrons are accelerated, then by colliding the electrons with gas molecules, a high ionization rate is obtained. By use of plasma generated by a mutual interaction between the helicon waves and electrons as described above, the etching process is carried out.

Figure 11:
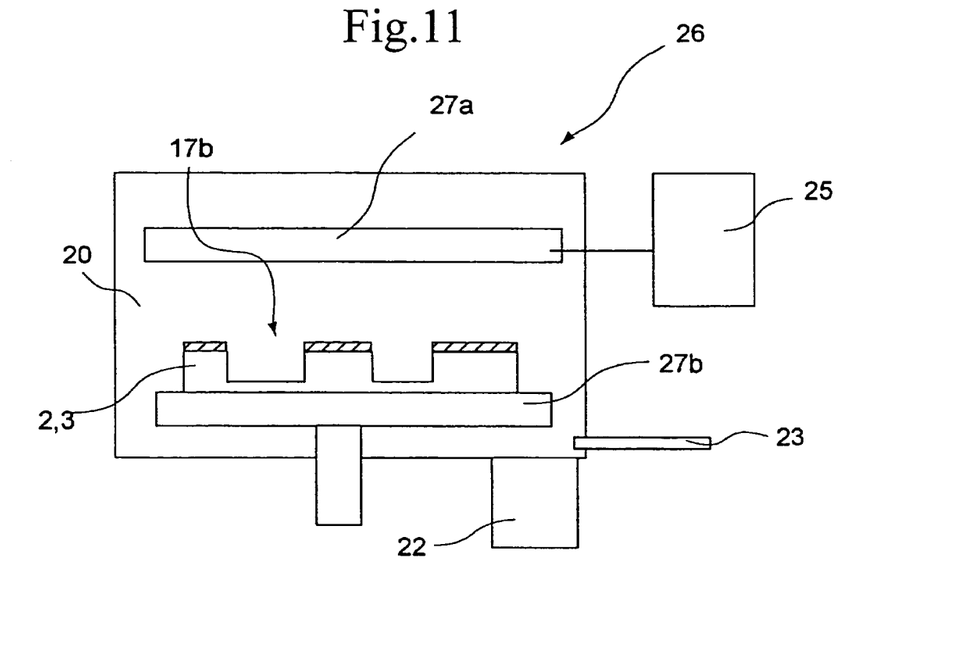
FIG. 11 is a schematic diagram showing an RIE apparatus used for forming the grooves of the cooling device according to the present invention.

FIG. 11 is a diagram showing a constitution of the RIE apparatus for forming the groove 17*b* whose cross-section has a right-angle from the groove 17*a* having the curved surface described above.

The RIE apparatus 26 has the vacuum chamber 20 for accommodating therein the glass substrate 2, 3. Inside the vacuum chamber 20, a pair of plate type electrodes 27*a* and 27*b* is disposed in parallel. Further, to the vacuum chamber 20, the vacuum pump 22 for depressurizing air within the chamber 20 is connected, and also the gas inlet port 23 for introducing a gas is provided.

The glass substrate 2, 3 formed with the groove 17*a* having the curved surface is loaded on a lower electrode 27*b* for the chamber 20. After loading the glass substrate 2, 3, the inside the vacuum chamber 20 is depressurized by the vacuum pump 22. After then, for example, a chlorinated gas or the like is introduced into the vacuum chamber 20 via the gas inlet port 23. Simultaneously, when the power supply 25 is turned on, an upper electrode 27*a* is applied with a voltage, and the lower electrode 27*b* becomes the ground potential. Further, the introduced chlorinated gas becomes a plasma state, and by accelerating plasma ions generated therein, they are collided onto the glass substrate 2, 3. By using these plasma ions, etching process is carried out.

By way of example, here, the introduced gas is referred to as the chlorinated gas, however, it is not limited thereto, and a gas containing halogen compounds such as fluorine or the like may be used as well.

Figure 12:
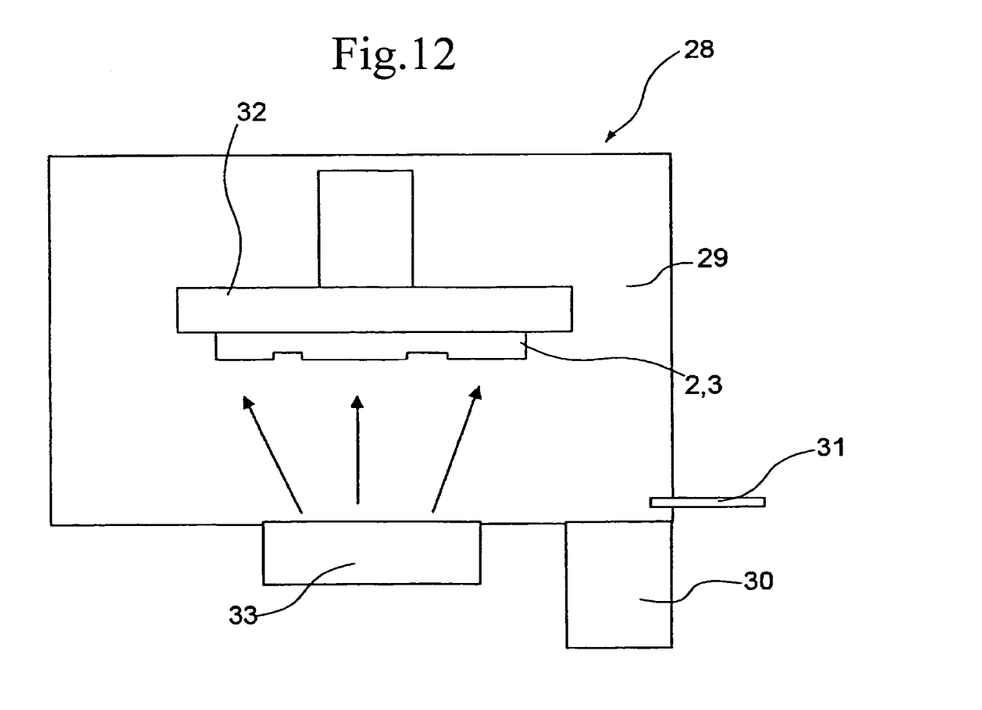
FIG. 12 is a schematic diagram showing a sputtering apparatus used for forming a thin film of the cooling device according to the present invention.

FIG. 12 is a diagram showing a constitution of a sputtering apparatus 28 for use in the above-mentioned processing.

The sputtering apparatus 28 is provided with a vacuum chamber 29, a vacuum pump 30 for depressurizing inside the vacuum chamber 29, and a gas inlet port 31 for introducing a gas.

In an upper portion inside the vacuum chamber 29, a substrate holder 32 for firmly holding the glass substrate 2, 3 is disposed, and in a lower portion opposing thereto, a target substrate 33 made of silicon is disposed. Further, a voltage applying section (not shown) for applying a voltage across the glass substrate 2, 3 and the target substrate 33 is connected.

Inside the vacuum chamber 29 is depressurized by the vacuum pump 30, and, for example, an argon gas is introduced into the vacuum chamber 29 as an inert gas via the gas inlet port 31.

Because the argon gas is introduced into the vacuum chamber 29, when a DC high voltage is applied across the glass substrate 2, 3 and the target substrate 33 by means of the voltage applying section, the argon gas is ionized. By causing the ionized argon gas to collide the target substrate 33, an expelled target substance is formed as a film on the glass substrate 2, 3. Thereby, a silicon member 4 of the target material is formed as a film on the glass substrate 2, 3.

By use of the sputtering method as described above, a thin film of the silicon member 4 can be formed uniformly on the substrate without limitation to the material of the substrate.

Figure 13:
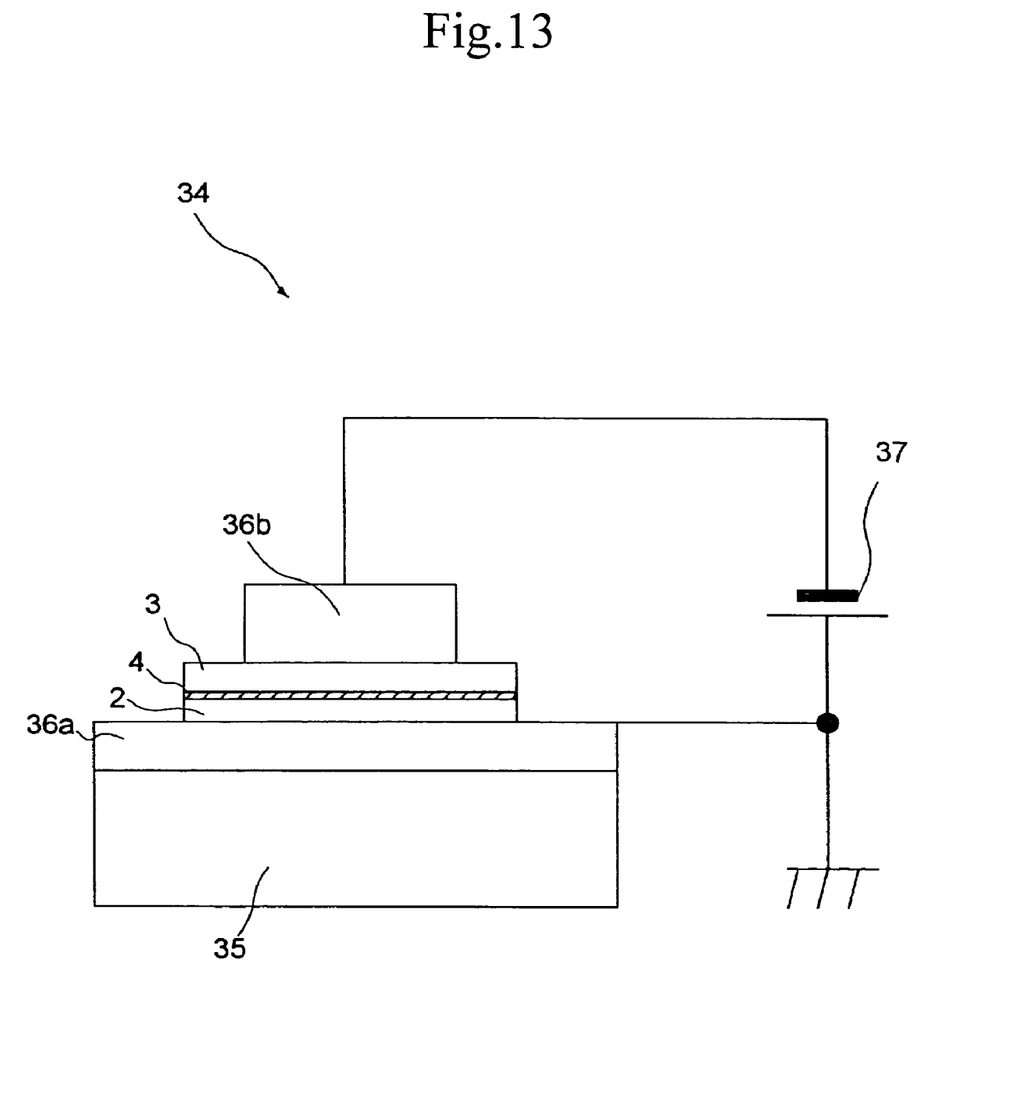
FIG. 13 is a schematic diagram showing an anodic bonding apparatus for use in the bonding step of the cooling device according to the present invention.

FIG. 13 is a diagram showing a schematic construction of an anodic bonding apparatus 34 for use in the bonding process described above.

The anodic bonding apparatus 34 is an apparatus for bonding two sheets of glass substrates 2 and 3 via the silicon member 4 as the bonding member.

The anodic bonding apparatus 34 is provided with a heater 35 for heating the whole of the anodic bonding apparatus 34, a lower electrode 36a and an upper electrode 36b disposed to interpose the glass substrates 2 and 3 to be bonded therebetween, and a power supply 37 for supplying power to these electrodes.

Using the heater 35, the anodic bonding apparatus 34 is heated approximately to 400° C. to 500° C. Further, by turning on the power supply 37, a voltage is applied across the lower electrode 36a and the upper electrode 36b. Thereby, a large electrostatic attraction force is generated acting on an interface between the silicon member 4 and each glass substrate 2, 3, thereby bonding them securely.

Figure 14:
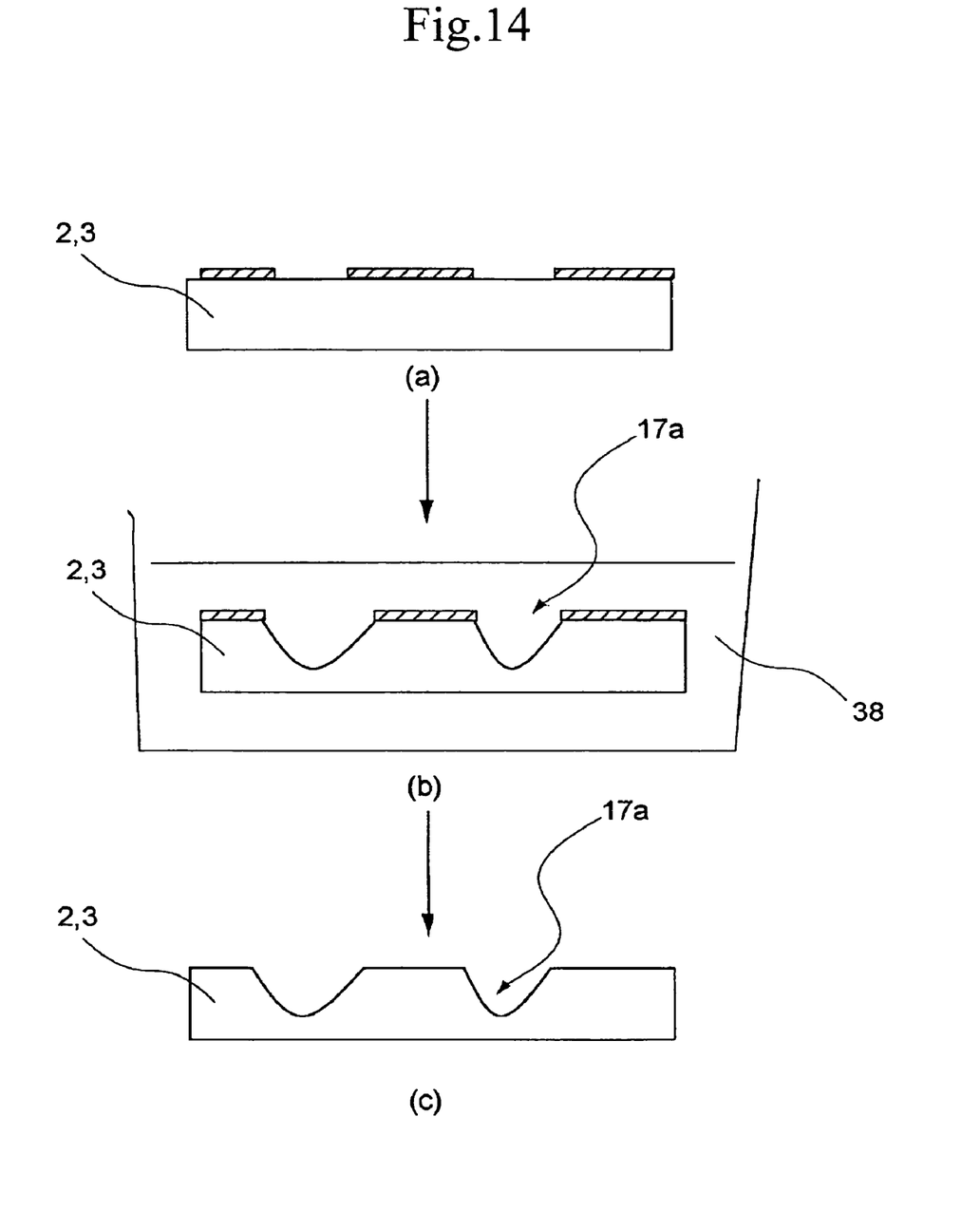
FIG. 14 is a schematic diagram showing a chemical etching process for use in the step of forming the grooves of the cooling device according to the present invention.

Further, according to the present invention, instead of the above-mentioned powder beam etching, a chemical etching as shown in FIG. 14 may be performed as well. A process of this chemical etching processing will be described in the following.

In this chemical etching process, the glass substrate 2, 3 having the patterning formed thereon (FIG. 14(a)) is introduced into an etching bath 38 filled with, for example, nitric acid (FIG. 14(b)). Whereby, the nitric acid corrodes a portion where the pattern is not formed with the resist, thereby performing the etching process (FIG. 14(c)).

As this etching process, likewise the above-mentioned powder beam etching, is intended to form grooves having a curved surface by fine particles, the above-mentioned second etching process is required afterward.

Figure 15:
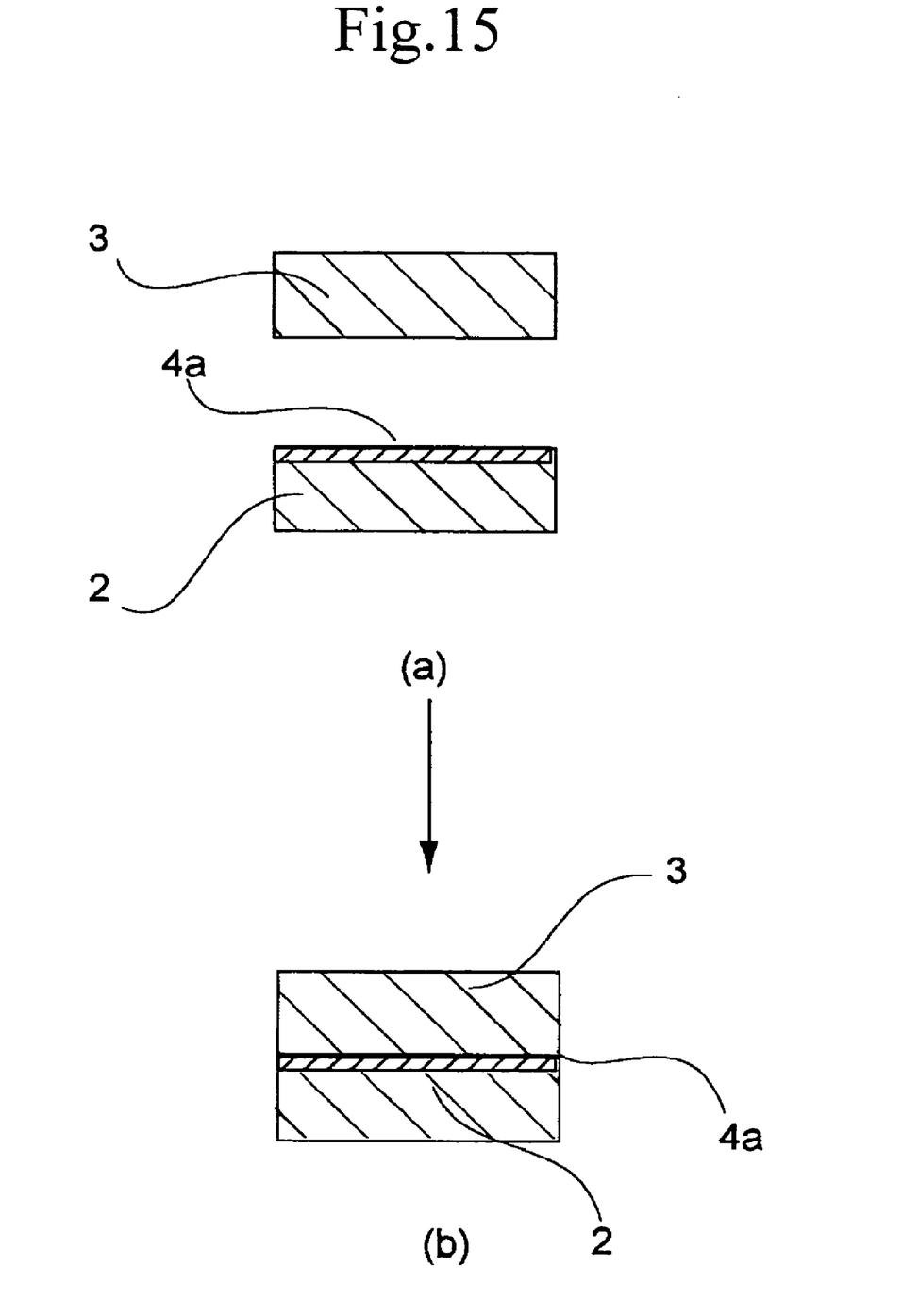
FIG. 15 is a diagram showing a process of manufacturing a cooling device according to another aspect of the preferred embodiment of the present invention.

FIG. 15 shows a simple manufacturing process flow in a case where the material of the substrate 2, 3 is made of plastic.

On the surface of the substrate 2, a copper thin film 4a is formed as a bonding member (FIG. 15(a)).

Then, the substrate 2 and the substrate 3 are bonded in a state with the copper thin film 4a interposed therebetween (FIG. 15(b)). A bonding method thereof includes the following ultrasonic bonding or thermal fusion bonding.

Figure 16:
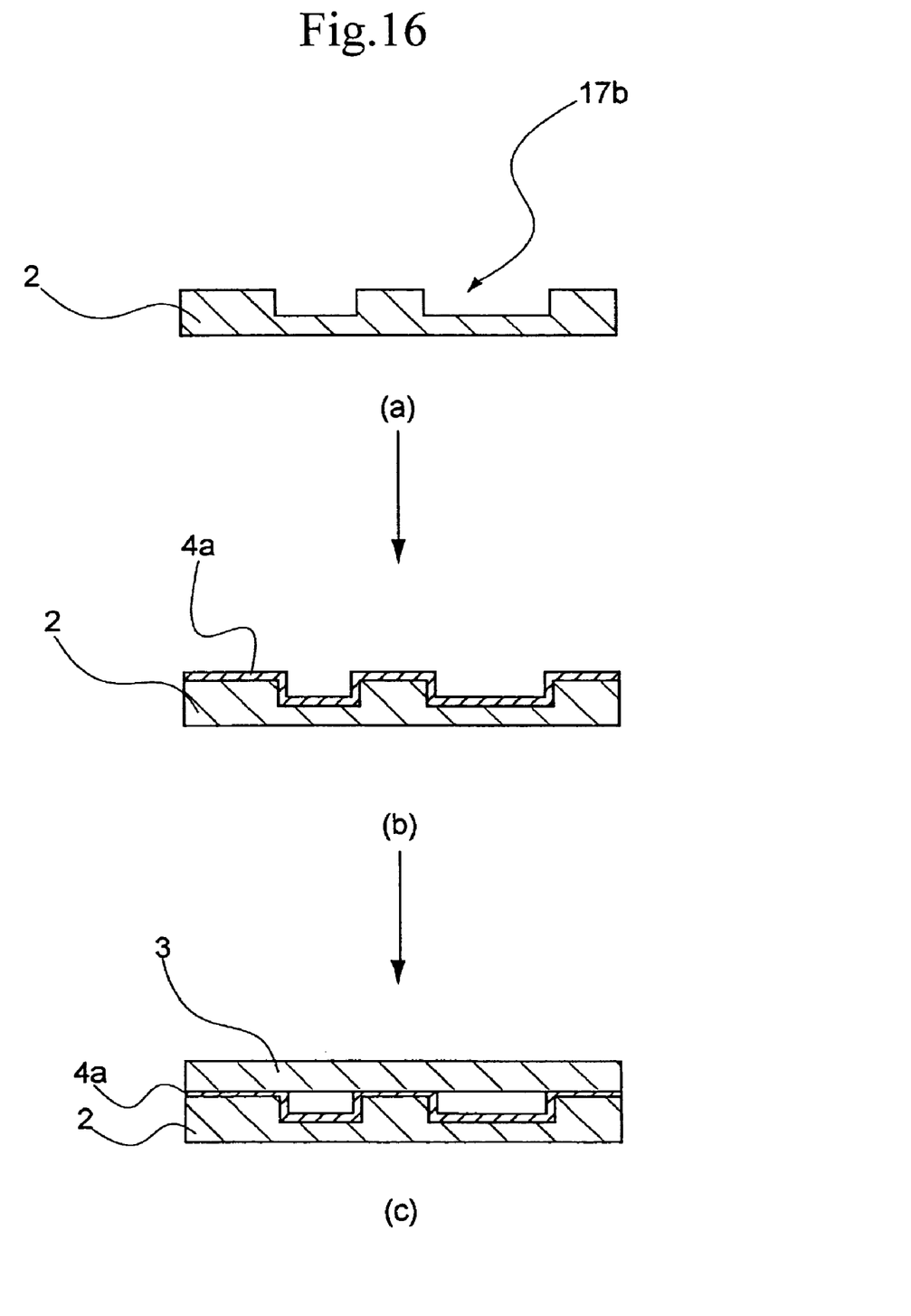
FIG. 16 is a schematic diagram showing an ultrasonic bonding process of the cooling device according to still another aspect of the present invention.

FIG. 16 is a diagram for explaining a ultrasonic bonding process.

As shown in FIG. 16(a), on the surfaces of two sheets of plastic substrate 2 with a groove 17b formed therein, a copper foil 4a is formed by sputtering (FIG. 16(b)).

Then, the two sheets of the plastic substrates 2, 3 are stacked as shown in the drawing, pressed, and are subjected to ultrasonic vibration. Thereby, ultrasonic energy destroys an oxide film on the bonding surface, as a result, activated copper atoms are allowed to bond with the plastic substrate.

Further, instead of the ultrasonic bonding, this bonding can be carried out by the thermal fusion bonding as well.

For example, two sheets of plastic substrates in a stacked state having the copper member interposed therebetween as the bonding member are heated. By application of this heating, the copper member interposed between these plastic substrates is melted to fuse with the plastic substrates.

By these methods also, these plastic substrates can be bonded via the copper member securely.

[Electronic Apparatus]

Figure 17:
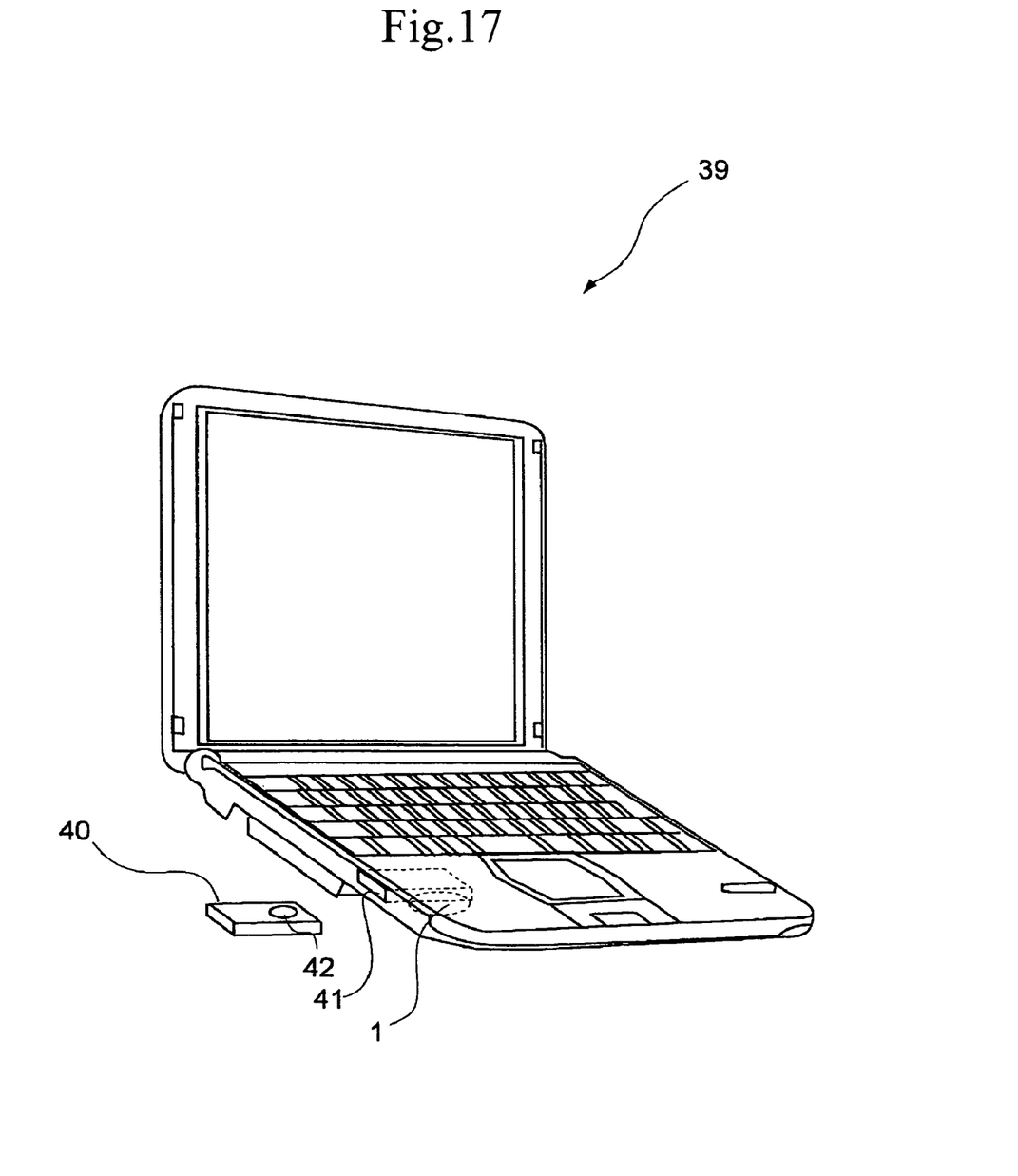
FIG. 17 is a schematic perspective view of a personal computer incorporating the cooling device according to the present invention.

FIG. 17 is a schematic, perspective view of a personal computer incorporating the cooling device according to the present invention.

A personal computer 39 has a slot 41 for allowing a card-type storage medium 40 containing a flash memory and a driver 42 to be loaded and unloaded therethrough.

The cooling device 1 according to the present invention is disposed in the personal computer 39 such that the wick thereof is positioned, for example, immediately below the driver 42 of the storage medium 40 loaded therein via the slot 41.

Although the electronic apparatus according to the present invention is described here by way of example of a personal computer, it is not limited thereto, and the cooling device according to the present invention may be installed in any other electronic apparatus such as a digital camera, video camera and the like as well.

As described heretofore, according to the present invention, the cooling device available in a compact and thin type and with an improved cooling performance, the electronic apparatus incorporating the same, and the method of manufacture thereof can be provided.

What is claimed is:

1. A cooling device comprising:
a pair of first and second substrates, made of a material having a thermal conductivity lower than that of silicon, disposed in opposition to each other, and having a groove formed in each opposing surface for constituting a closed loop heat pipe, said formed grooves being non-congruent to each other; and
a bonding member interposed between said first substrate and said second substrate for bonding said first substrate and said second substrate.

2. A cooling device according to claim 1, characterized in that said first and said second substrates are composed of glass or plastic.

3. A cooling device according to claim 1, characterized in that said bonding member is composed of silicon or copper.

* * * * *